United States Patent [19]

Gilkeson et al.

[11] 4,207,557

[45] Jun. 10, 1980

[54] USER ELECTRIC ENERGY CONSUMPTION APPARATUS

[76] Inventors: Robert F. Gilkeson, 1084 Broadview Rd., Wayne, Pa. 19087; John B. Blose, 2195 Winding Way, Broomall, Pa. 19008

[21] Appl. No.: 798,943

[22] Filed: May 20, 1977

[51] Int. Cl.² .................. G08C 19/26; G01R 21/06
[52] U.S. Cl. ........................ 340/178; 235/92 EL; 324/116; 324/142; 340/206; 364/464; 364/483
[58] Field of Search ............ 340/178, 177 CA, 188 R, 340/310 A, 310 CP, 207 R, 206, 203; 235/92 EL; 324/116, 113, 142; 364/483, 464

[56] References Cited

U.S. PATENT DOCUMENTS

| | | | |
|---|---|---|---|
| 1,121,121 | 5/1914 | Murray | 324/103 R |
| 1,138,513 | 5/1914 | Stempel | 324/116 |
| 2,039,863 | 5/1936 | Williams | 324/103 R |
| 2,070,340 | 2/1937 | O'Bryan | 340/310 A |
| 3,221,926 | 12/1965 | Winiger | 221/2 |
| 3,264,633 | 8/1966 | Hellar | 340/310 R |
| 3,388,388 | 6/1968 | Brown | 340/203 |
| 3,502,980 | 3/1970 | Baggott | 324/103 |
| 3,624,361 | 11/1971 | Rossi et al. | 235/92 AC |
| 3,641,536 | 2/1972 | Prosprich | 340/206 |
| 3,683,343 | 8/1972 | Feldman et al. | 340/178 |
| 3,840,866 | 10/1974 | St. Clair et al. | 340/188 R |
| 3,846,789 | 11/1974 | Germer et al. | 340/204 |
| 3,924,224 | 12/1975 | Dyer | 340/310 A |
| 3,924,251 | 12/1975 | Crask | 340/190 |
| 3,925,728 | 12/1975 | Whyte | 340/310 R |
| 4,004,097 | 1/1977 | Spaulding | 340/150 |
| 4,080,568 | 3/1978 | Funk | 324/142 |
| 4,106,095 | 8/1978 | Yarbrough | 364/464 |
| 4,120,031 | 10/1978 | Kincheloe et al. | 324/113 |
| 4,132,981 | 1/1979 | White | 340/203 |

OTHER PUBLICATIONS

Popular Science, Mar. 1976, p. 152, "Power Meter".

*Primary Examiner*—John W. Caldwell, Sr.
*Assistant Examiner*—James J. Groody
*Attorney, Agent, or Firm*—Paul & Paul

[57] ABSTRACT

A supplemental energy register in which successive increments of consumed electrical energy are detected at a kilowatthour meter, and are translated into electrical pulse signals. Digital calculation and display logic is operated by the pulses, either directly or through intermediate transmission over the household network. Kilowatthours are directly accumulated in increments corresponding to those sensed at the meter, while net cost is computed by chain addition utilizing the prevailing cost per increment rate, which is maintained in a keyboard controllable memory. The register may desirably be inserted in the leads connecting an electric utilization device to the local common network.

6 Claims, 5 Drawing Figures

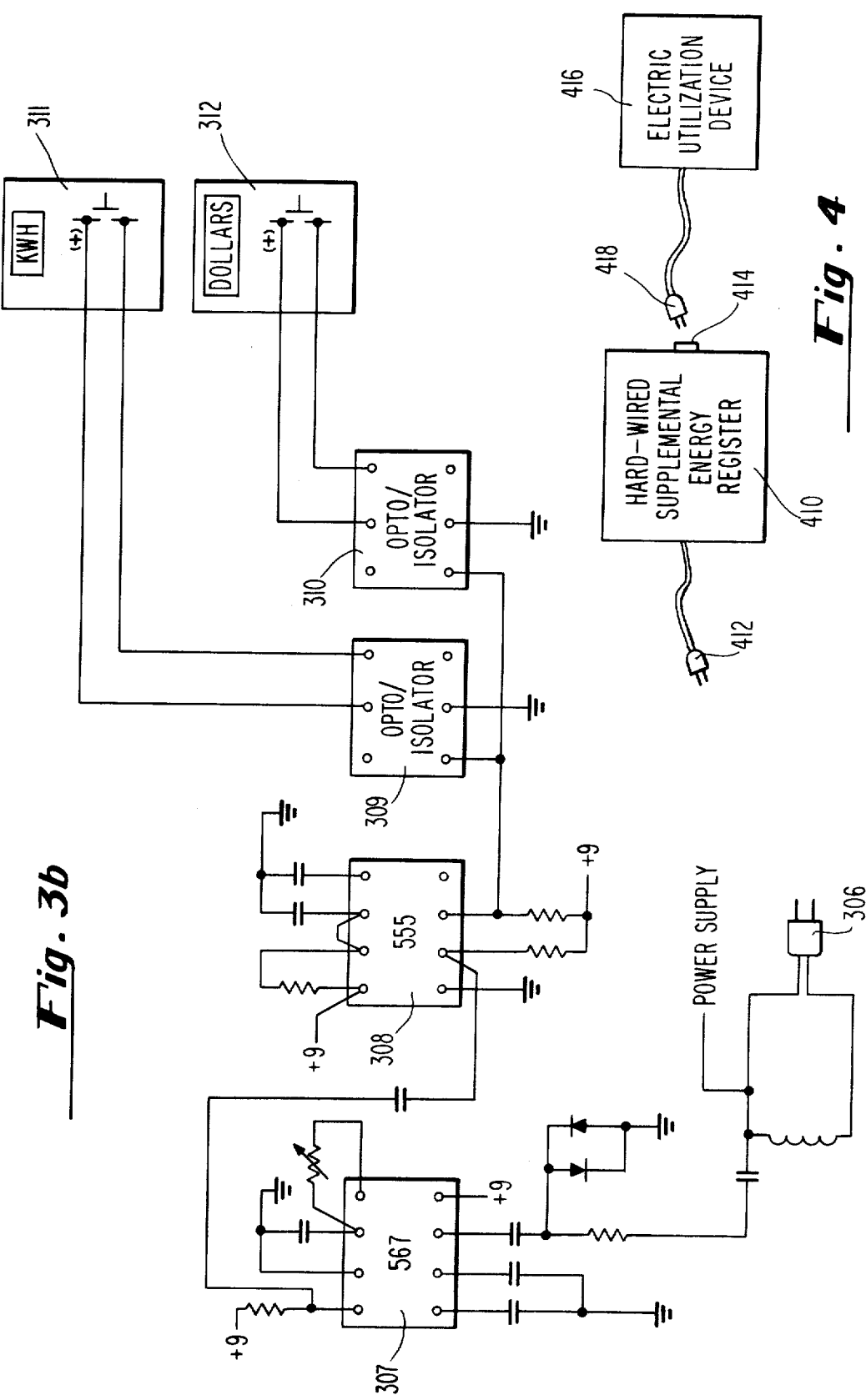

USER ELECTRIC ENERGY CONSUMPTION APPARATUS

BACKGROUND OF THE INVENTION

This invention relates to metering apparatus, and more particularly to apparatus for informing utility customers of their cumulative energy consumption of utilization devices and the cost thereof.

The conventional method of determining customer use of electric energy is to locate a kilowatthour meter at the entry point of the customer's network. Such devices employ a variety of registration modes, including cyclometers or dial type registers. The former, in appearance identical to an automobile odometer, is easily read by the customer. Dial type registers are in more common usage, and are somewhat more difficult to read precisely. None of the meters in general usage gives the customer direct indications of the cost of the energy being consumed. Hence, even if the customer is able accurately to read his kilowatthour consumption from his meter, the practical economic effect thereof is still not apparent, unless a record is kept of successive readings, and necessary cost calculations are performed thereon. Even if the customer is willing and able to take such periodic readings from perhaps inconveniently located house meters and to make the necessary calculations, such information would then be available only for the entire consumer network and not for individual applicances.

Increasing electrical costs have made residential customers acutely aware of the impact of energy consumption and energy conservation upon every day budgets. Increasing prices and confusing bills sometimes cause the consumer to claim erroneous readings by the power company, in the belief that such extensive consumption as indicated on the bill could not have been possible. Furthermore, the present metering systems make it difficult for consumers to adopt comprehensive and effective energy conservation programs, since most of the conservation programs must be based on guess work and assumptions.

It is a primary object of the present invention to provide a display apparatus which registers in convenient decimal form the cumulative consumption of electrical energy by the customer, as well as the dollar and cent cost of that consumption.

It is a further object of the present invention to extract information for processing into cumulative kilowatthour consumption and costs, from a kilowatthour meter.

It is another object of the present invention to provide convenient apparatus for detecting cumulative energy consumption and cost thereof for individual electric utilization devices connected to a local consumer network.

It is a still further object of the present invention to provide apparatus for depicting cumulative energy consumption and cost in a metering means which is conveniently portable, and which thereby may be placed or replaced at any desired position within the home or place of business of the consumer.

SUMMARY OF THE INVENTION

The present invention involves the generation of control pulses at a kilowatthour meter, based upon consumption of corresponding increments of energy. The control pulses may be utilized either directly by apparatus located at the meter, or may be impressed upon the local network for processing and reading by the consumer at a convenient spacially disparate point in the consumer's household or business. In the latter case, signal bursts of predetermined duration and frequency are coupled onto the customer's electric network, and are decoupled therefrom at any electrical outlet selected by the customer. Each burst represents a uniform increment of consumption; therefore, the burst may be utilized to actuate a counter which displays cumulative kilowatthour consumption. The bursts also are utilized to operate a cost calculator, which maintains costs by chain addition of a cost factor per specified increment.

DESCRIPTION OF THE DRAWINGS

FIGS. 3a and 3b show a detailed circuit schematic for the FIG. 2 embodiment; and FIG. 4 shows a block diagram of the supplemental energy register of FIG. 1 arranged for connection between an electric utilization device and a local consumer network.

DETAILED DESCRIPTION

Figure 1:
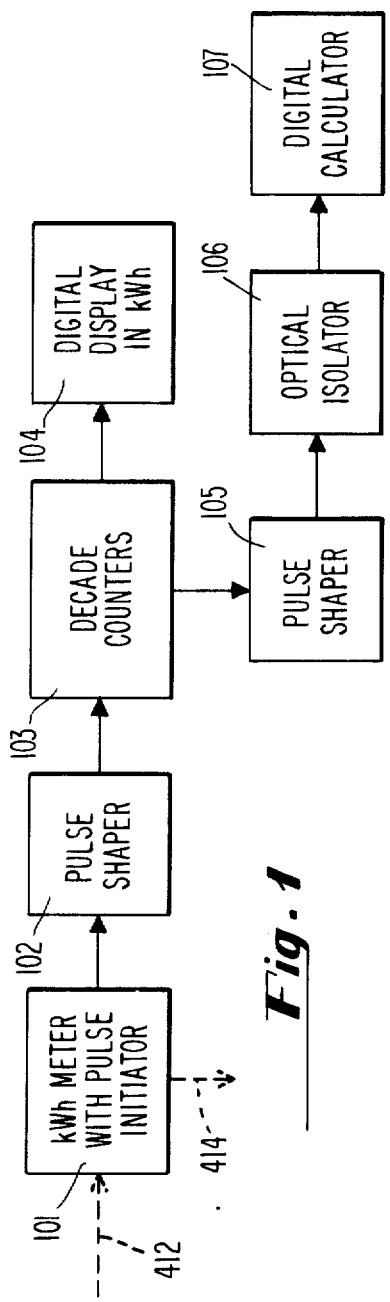
FIG. 1 shows a block diagram of a first illustrative embodiment of the supplemental energy register, which features power consumption and cost displays hard-wired to a kilowatthour meter.

Referring first to FIG. 1, there is shown an embodiment of the present invention wherein the power consumption and cost calculation apparatus is hard-wired to a conventional kilowatthour meter. Specifically, meter 101 is embodied as any of the types of such apparatus in common usage such as the familiar induction type kilowatthour meter. Typically, these may feature rotating dials, the position of which represent consumption of energy detected by the meter as it is consumed in the home network. Phantom interconnections 412 and 414 are relevant to the embodiment of FIG. 4, discussed hereinafter. In accordance with the principles of the present invention, a select dial in the meter mechanism 101 is provided with an adjacent cam actuated switch, which is closed each time the associated dial is incremented by a predetermined amount (e.g., 1 turn or 0.2 kilowatthours). The closure of the switch drives a pulse shaper 102, which for each such increment produces a control pulse of predetermined amplitude and duration. In a preferred embodiment, pulse shaper 102 comprises a monstable multi-vibrator, embodied as an integrated circuit commercially available under the trade designation Signetics 555 Timer. The input to the timer is operated by the cam actuated switch associated with meter 101, and produces an output pulse for each closure thereof. These control pulses are coupled to a decade counter 103.

Decade counters 103 function to accumulate the serial pulses from the pulse shaper 102, and to present the accumulated total in binary coded form. In a preferred embodiment, decade counters 103 present the total to a digital display unit 104, which thereby affords the consumer an accurate depiction of accumulative kilowatthour consumption, in digital format.

Each increment of the decade counters 103 causes a signalling pulse to be conveyed to another pulse shaper 105, which is embodied similarly to and functions the same as pulse shaper 102. Hence, for each changed increment of kilowatthour display 104, a pulse of predetermined amplitude and duration is coupled to an optical isolator 106, thence also to increment a digital calculator 107 which provides the indication of costs to the consumer of the kilowatthour consumption displayed at 104. Optical isolator 106 is embodied as a commercially available light emitting diode (LED)—photo diode combination, which isolates the calculator 107 from the foregoing circuitry, and prevents electrical signalling and computation at the calculator 107 from affecting the previously described input logical operations.

Calculator 107 performs the function of chain addition of a cost per energy consumption factor, one such addition for each pulse coupled to calculator 107 from pulse shaper 105 via optical isolator 106. Hence, although circuitry may be especially designed to embody calculator 107, it will also be convenient to utilize a slightly modified conventional electronic calculator, whereby the customer may utilize calculator 107 for miscellaneous unrelated household computation functions in addition to reading kilowatthour cost as described herein. As is set forth in greater detail in FIG. 3, the functions ascribed to calculator 107 in FIG. 1 are met if pulses from optical isolator 106 are utilized to energize iterative addition of the cost factor quantity maintained in the memory of calculator 107, with a cumulative total cost figure. To this end, the customer's energy cost rate (i.e., actual cost per increment of energy consumed noted at meter 101 and shaper 102) is entered into the memory of calculator 107, and likewise may be easily changed thereafter as energy consumption costs are changed.

In summary, in accordance with the embodiment of FIG. 1, a suitable energy consumption increment is selected which is directly and conveniently readable from meter 101, and the cost of that increment is entered into the memory of calculator 107. Each such increment of consumption is sensed at 102, accumulated at 103, and the accumulated total consumption is displayed at 104. Simultaneously, the net cost of the cumulative total shown at 104 is calculated and displayed at 107.

Figure 2:
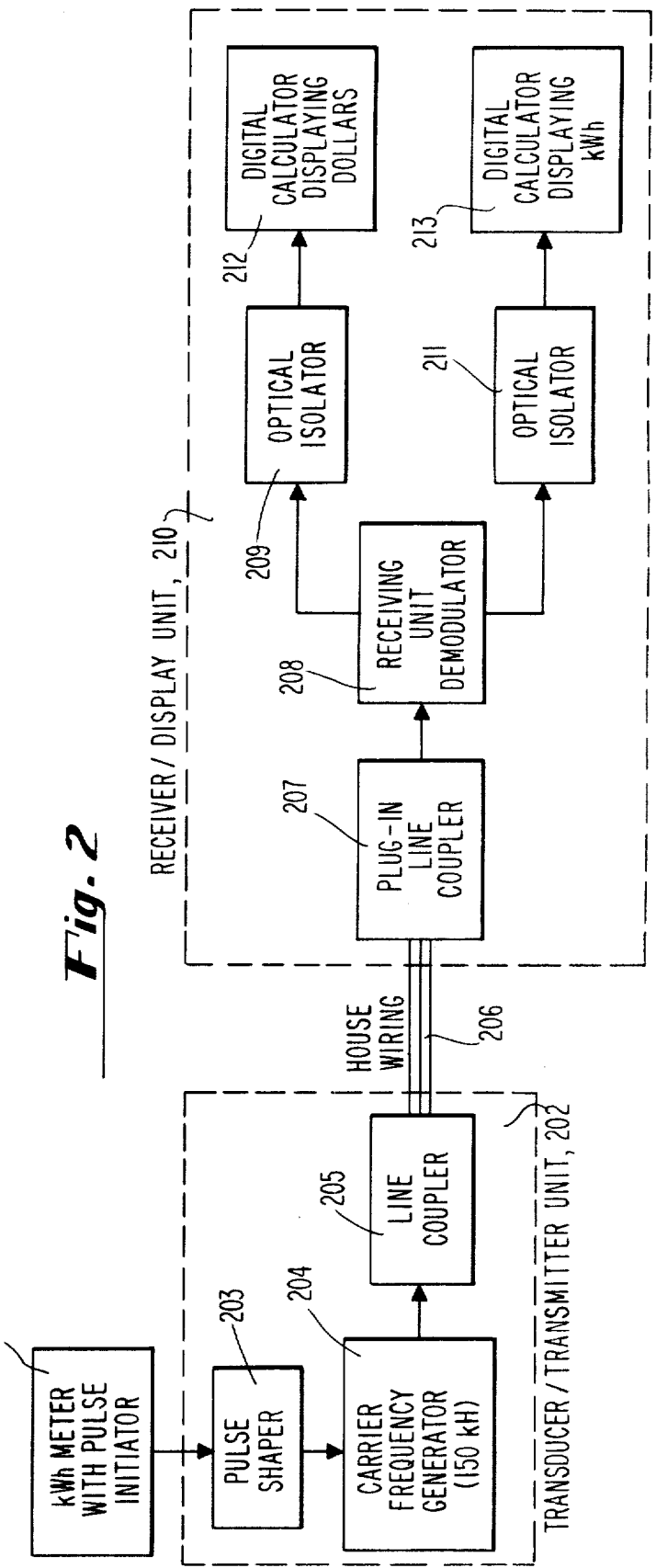
FIG. 2 shows a block diagram of an illustrative embodiment of the supplemental energy register wherein signalling occurs over house wiring.

Referring next to FIG. 2, there is shown an alternative embodiment of the principles of the present invention adapted for a portable receiver display unit 210 which may be plugged into any receptacle in the house wiring system. In particular, the embodiment of FIG. 2 involves a transducer/transmitter unit 202 hard-wired to a kilowatthour meter 201 which may be unitary therewith, and a receiver-display unit 210 which is portable and which plugs into the house wiring 206. The kilowatthour meter 201 is similar in structure and function to meter 101 to the FIG. 1 embodiment, and includes switch means and the like to generate a pulse upon each successive consumption of a predetermined increment of electrical energy. The transducer/transmitter unit 202 includes a pulse shaper 203 identical in structure and function to pulse shaper 102 of FIG. 1. Hence, upon each successive consumption of the prescribed increment of power, shaper 203 produces a pulse of predetermined amplitude and duration, which is coupled to and which energizes a coding means 204.

The coding means 204 serves the function of generating suitable indicia of the occurence of consumption of the prescribed energy increment, for transmission throughout the wiring system which distributes the energy monitored by meter 201. In a preferred embodiment, coding means 204 includes a carrier frequency generator enabled by pulses from the pulse shaper 203 to issue a signal burst of prescribed frequency and duration (e.g., a 150 Khz burst of duration equal to the pulses from shaper 203). The bursts from frequency generator 204 are conveyed to the house wiring system 206 via a suitable line coupler 205, for example a capacitive coupling network, or a transformer having its primary coils supplied by generator 204, and its secondary coils connected in the house wiring system.

In partial summary, the FIG. 2 embodiment employs means for identifying consumption of predetermined increments of energy, which in response to consumption of each such increment, applies a representative signal through the house wiring system.

The receiver-display unit 210 is adapted to plug into receptacles of wiring system 206, and to receive and decode signals on the house wiring system which are transmitted thereon by the transducer/transmitter unit 202. Accordingly, the receiver-display unit 210 involves a plug-in line coupler 207, such as of the capacitive or the transformer types, which feeds signals on the house wiring system 206 to a receiving unit 208. Unit 208 serves to detect and decode indicia of successive energy consumption increments. For each such detection of a burst, receiving unit 208 produces an energizing signal which is respectively coupled to operate output display devices 212 and 213 via optical isolators 209 and 211. The isolators 209 and 211 are each identical in form and function to the isolator 106 previously described in conjunction with the embodiment of FIG. 1.

In particular, isolator 209 energizes a suitably programmed calculator 212 further to perform a chain addition to display cumulative energy consumption costs. In a preferred embodiment, calculator 212 is identical in form and function to the calculator 107 of FIG. 1.

Optical isolator 211 conveys the control signal for the demodulator 208 to increment the cumulative kilowatthour consumption at 213. The means for calculating and displaying kilowatthour consumption 213 may be embodied similarly to the decade counter 103 and digital display 104 as described hereinbefore, or alternatively may duplicate functionally the cost accumulation function as performed by calculator 212 of FIG. 2 or 107 of FIG. 1.

Figure 3A:
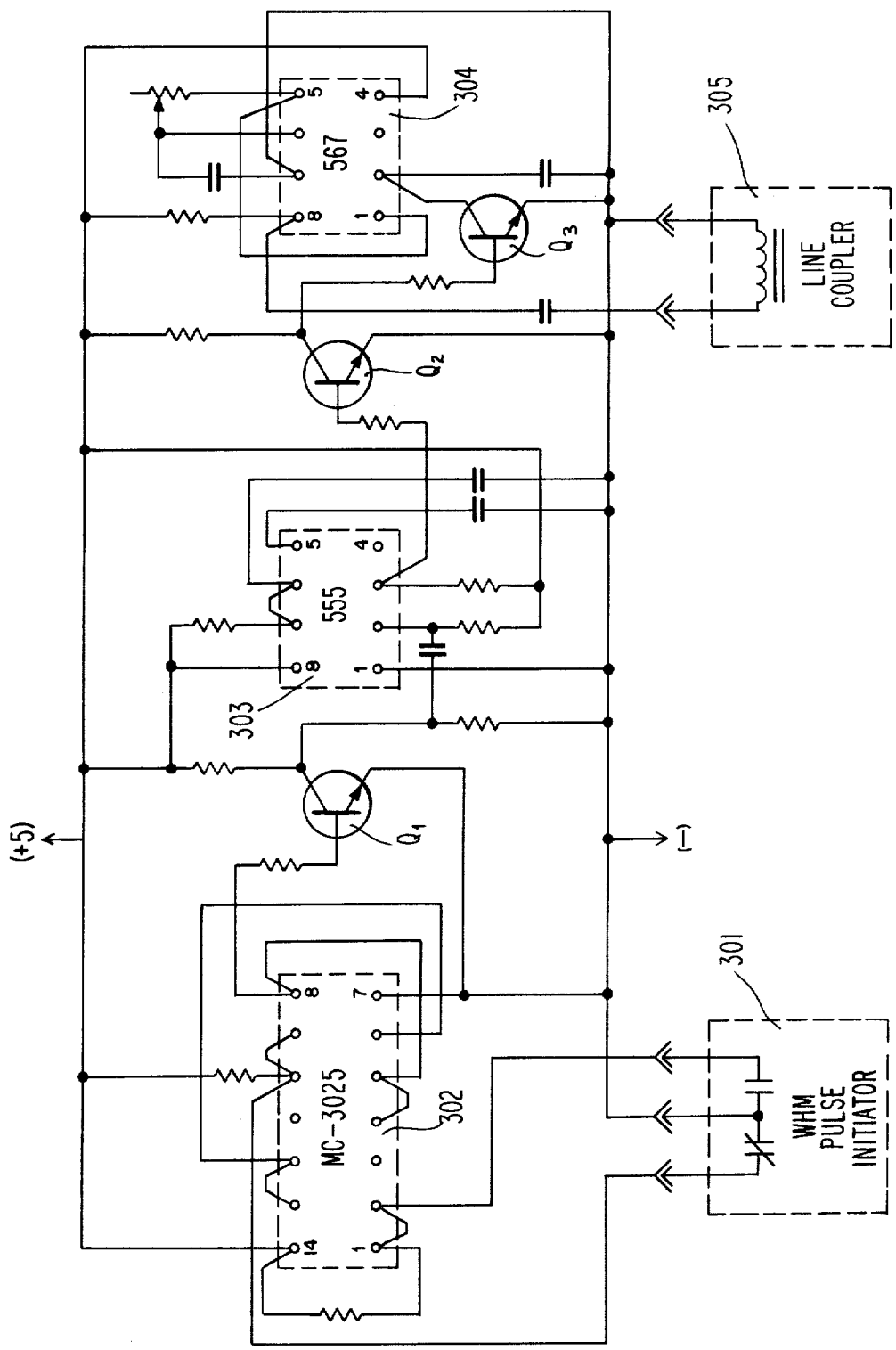

Referring next to FIGS. 3a and 3b, there is set forth a schematic representation of a preferred embodiment of the present invention. Specifically, FIG. 3a sets forth a preferred embodiment for the transducer/transmitter unit 202 of FIG. 2 and FIG. 3b sets forth a preferred embodiment for the receiver/display unit 210.

In FIG. 3a, a pulse initiator 301 senses increments of energy consumed, as represented by successive predetermined measurements at the kilowatthour meter. Pulse initiator 301 includes a cam actuated pair of contacts coupled to a logic circuit 302, which not only senses the passage of another increment, but also involves an "anti-bounce" facility whereby only a single increment is registered for each such increment consumed, and spurious contact closures at the initiator 301 are not erroneously interpreted as consumptions of further increments. Logic 302 involves NAND logic, conveniently embodied as a commercially available dual four-input NAND gate designated "MC 3025", appropriately biased pursuant to the circuit specifications and having transistor $Q_1$ biased for operation thereby. Hence, the two switches of initiator 301 are successively operated by the dial of the kilowatthour meter on a set-reset basis, whereby contact bounce at one relay switch or the other is prevented from energizing the transducer/transmitter unit 202. It is to be understood that this "anti-bounce" feature is optional, and serves to eliminate erroneous transmissions in accordance with the principles of the present invention.

Each single predetermined increment of consumption registered by the meter 201 energizes a one-shot operation at 303 via initiator 301, NAND gates 302 and transistor $Q_1$ which one-shot 303 is as a commercially available "555" timer. A phase locked loop 304 is thereby energized, the output of which is derived from the voltage controlled oscillator thereof. Hence, the loop 304 produces a burst of signal, as gated by the one-shot 303, onto the house wiring via a transformer type line coupler 305. The phase locked loop 304 advantageously is embodied as a commercially available integrated circuit, having the trade designation "567".

In FIG. 3b, there is shown a receiver-display unit 210, which may be inserted into any convenient receptacle of the house wiring system by means of a plug 306. The signal is coupled to a decoding phase locked loop 307 which is matched to the encoding phase locked loop 304 of FIG. 3a. The output of the decoding loop 307, advantageously derived from the phase comparator thereof, is once more in the form of a voltage level, rather than a frequency burst. That level is utilized to energize another one-shot 308, which produces an output pulse of desired amplitude and duration for energizing the kilowatthour and dollar calculators 311 and 312, via the optical isolators 309 and 310. Hence, each pulse from the output of the "555" timer embodying one-shot 308, via isolators 309 and 310, respectively energizes suitable addition and/or calculation kilowatthour and dollars at 311 and 312.

The foregoing has set forth illustrative and preferred embodiments of the principles of the present invention, but it is to be understood that numerous alternative embodiments will occur to those of ordinary skill in the art without departure from the spirit or scope of the present invention.

As illustrated in FIG. 4, the hard wired-wired supplemental energy register 410, comprising a unitary modification of the device of FIG. 1, is supplied with an electric cord terminating in an attachment plug 412 for connection to a receptacle of the house wiring system (not illustrated), and a receptacle 414 to receive the plug 418 of the attachment cord of a conventional electric utilization device 416. Interconnections 412 and 414 are shown in phantom in FIG. 1. The register may then be conveniently used to monitor the energy consumption and cost for a single appliance.

In a similar manner, the hard-wired register 410 may be connected to measure the energy consumption and cost for the composite load on a branch circuit of the consumer network. Our supplemental energy registers may comprise the consumer entrance billing kilowatthour meter for initiating the control signal bursts, and thus provide convenient direct readings of cost of energy consumption for the complete local consumer network.

Instead of the induction-type kilowatthour meter 101 being of the familiar type with a pulse initiator using a contact-making switch for initiating incremental kilowatthour pulses, the kilowatthour with pulse initiator may be any of the more recently developed solid state watthour transducer types, for example, such as the SC60 Watt/Watthour Standard manufactured by Scientific Columbus Co. of Columbus, Ohio.

Similarly, as in the hard-wired register 410 of FIG. 4, the kilowatthour meter with pulse initiator 201 and the transducer/transmitter 202, of FIG. 2, may be combined into a unitary device (not illustrated) and plugged in between a house wiring receptacle and an electric utilization device such as 416. The receiver/display unit 210 may then be disposed and connected to the house wiring network at some other receptacle location conveniently suitable for the desired monitoring.

Although the register of FIG. 4 has been illustrated as for connection to a two-wire circuit, it is evident that it is equally applicable to three-wire single-phase circuits and to multiphase circuits. It is also evident that the portability of the devices described in the foregoing may appropriately be enhanced by minimizing the size and weight of the components.

Most particularly, it will be appreciated that numerous coding schemes are known in the art which are quite compatible with the house wiring transmission scheme utilized herein. For example, this includes forms of analog and pulse modulation whereby information relating to the cost calculations may be transmitted, as well as the bare indication of consumption of a predetermined increment. Likewise, provision may readily be added to the system for calculation of costs at rates variable at different times through the day, or rates variable in accordance with the levels of energy actually consumed. Such provisions would of course involve installation of appropriate memory at the calculators or at the meter itself, whereby the various respective rates may be stored, and coupled into the calculation by suitable time actuated or cumulative consumption actuated control.

We claim:

1. User electric energy consumption apparatus connectable to an electric network having conductors and a user meter connected thereto for evaluating energy consumption and the net cost thereof, comprising:

switch means for generating pulses, said pulse generating switch means being connected to said meter and have a pair of successively operated switches being set-reset interconnected;

pulse shaper means for providing a pulse of predetermined amplitude and duration, said shaper means being responsive to said switch means;

signal means for imparting a coded signal upon said electric network conductors in response to pulses from said pulse shaper means, said coded signal imparting means being connected to the output of said pulse shaper means wherein said signal imparting means includes means, connected to said pulse shaper means, for generating a frequency, said frequency being generated in bursts, said frequency burst being said coded signal imparted to said electric network conductors;

means, located at a disparate point of said electric network for sensing said coded signal frequency bursts from said conductors;

first calculator means, connected to said signal sensing means, for calculating and digitally displaying energy consumption, said first calculator means including a first calculator programmed to perform chain addition and providing a digital display of consumption, said first calculator including a first decade counter connected to said signal sensing means and a first digital display connected to said first decade counter; and second calculator means, connected to said signal sensing means, for calculating and digitally displaying energy consumption cost, said second calculator means including a second calculator programmed to perform chain addition and a digital display of cost, said second calculator including a second decade counter connected to said signal sensing means and a second digital display connected to said second decade counter.

2. The apparatus of claim 1 wherein said coded signal sensing means includes:

means for coupling to said electric network conductors, said coupling means being connected thereto and transmitting said coded signal frequency bursts imparted on said electric network conductors;

means for demodulating said coded signal frequency bursts, said demodulating means being connected to said coupling means;

first optical isolator means for connecting said demodulating means to said first decade counter; and second optical isolator means for connecting said demodulating means to said second decade counter.

3. The apparatus of claim 2 wherein said pulse generating switch means includes:

a pulse initiator connected to said meter, said pulse initiator having a cam actuated pair of contacts;

a pair of four-input NAND gates connected to said pulse initiator pair of contacts; and a transistor connected to said pair of NAND gates being biased for operation thereby.

4. The apparatus of claim 3 wherein said pulse shaper means includes a first one-shot, said first one-shot being connected to said pair of NAND gates via said transistor.

5. The apparatus of claim 4 wherein said carrier frequency generating means includes a first phase locked loop having a first voltage controlled oscillator thereof and being gated by said first one-shot to provide said bursts of frequency.

6. The apparatus of claim 5 wherein said demodulating means includes a second phase locked loop matched to said first phase locked loop, said second phase locked loop being connected to said coupling means; and a second one-shot activated from the output of said second phase locked loop, said second one-shot output being connected to said first optical isolator means and said second optical isolator means.

* * * * *